United States Patent
Yokoyama et al.

(10) Patent No.: US 7,085,946 B2
(45) Date of Patent: Aug. 1, 2006

(54) BACKUP MEMORY CONTROL UNIT WITH REDUCED CURRENT CONSUMPTION HAVING NORMAL SELF-REFRESH AND UNSETTLED MODES OF OPERATION

(75) Inventors: Chikara Yokoyama, Hyogo (JP); Kyoji Higasa, Tokyo (JP); Kazuyoshi Ohtsuka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 525 days.

(21) Appl. No.: 10/395,098

(22) Filed: Mar. 25, 2003

(65) Prior Publication Data

US 2003/0189862 A1 Oct. 9, 2003

(30) Foreign Application Priority Data

Apr. 5, 2002 (JP) ............................. 2002-104319

(51) Int. Cl.
*G06F 1/28* (2006.01)
*G06F 1/30* (2006.01)
*G06F 1/32* (2006.01)
*G11C 5/14* (2006.01)

(52) U.S. Cl. .................. 713/322; 713/320; 713/323; 713/324; 713/340; 365/226; 365/227; 365/228; 365/229

(58) Field of Classification Search .................. None
See application file for complete search history.

(56) References Cited

U.S. PATENT DOCUMENTS 5,862,093 A * 1/1999 Sakakibara ................ 365/222
5,905,994 A * 5/1999 Hori et al. .................. 713/324
5,930,192 A * 7/1999 Ishikawa ..................... 365/229
5,944,828 A   8/1999 Matsuoka
6,084,813 A * 7/2000 Kikuchi et al. ............. 365/222
6,088,762 A * 7/2000 Creta ........................... 711/106
6,266,776 B1 * 7/2001 Sakai ........................... 713/300
6,317,657 B1 * 11/2001 George ........................ 700/286

FOREIGN PATENT DOCUMENTS

| JP | 61271695 A  | * | 12/1986 |
| JP | 11-053271   |   | 2/1999  |
| JP | 11-353243   |   | 12/1999 |

OTHER PUBLICATIONS

"Advanced Configuration and Power Interface Specification", Feb. 2, 1999, Intel Corp., Microsoft Corp., Toshiba Corp., Revision 1.0b, pp.: 1-2, 220-225.*

Tanenbaum, "Structured Computer Organization", 1984, Prentice Hall, pp.: 10-12.*

* cited by examiner

*Primary Examiner*—James K. Trujillo
(74) *Attorney, Agent, or Firm*—Sughrue Mion, PLLC

(57) ABSTRACT

A backup memory control unit can reduce the current consumption when a memory (SDRAM) is inactive by providing the memory with an unsettled mode in which no power is supplied to the memory. It provides the memory with the unsettled mode, and halts the power supply from a backup power supply to the SDRAM in the unsettled mode in which the SDRAM is not in operation, thereby limiting an increase in the current consumption. The functions are executed by a hardware circuit without using a backup microcomputer.

6 Claims, 9 Drawing Sheets

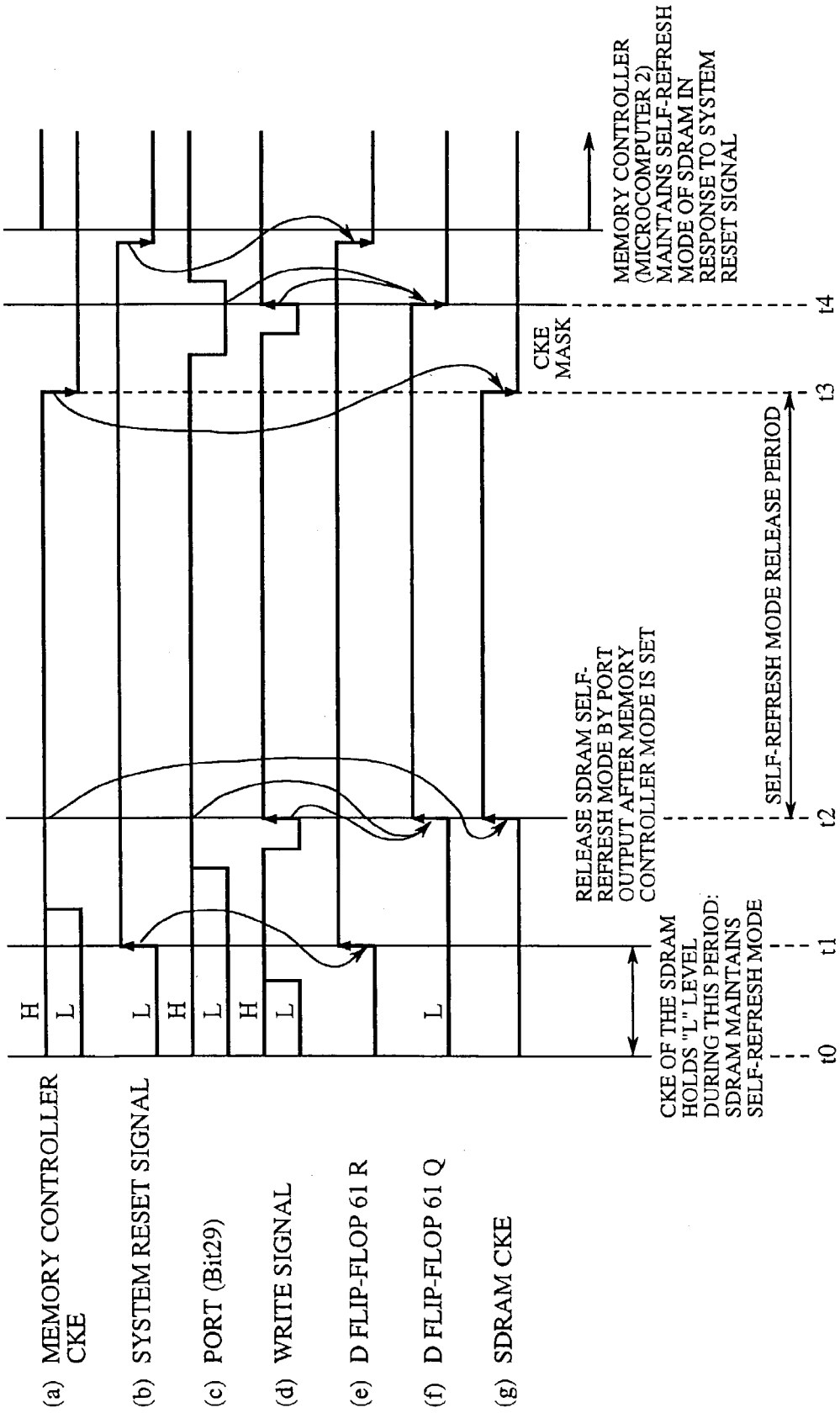

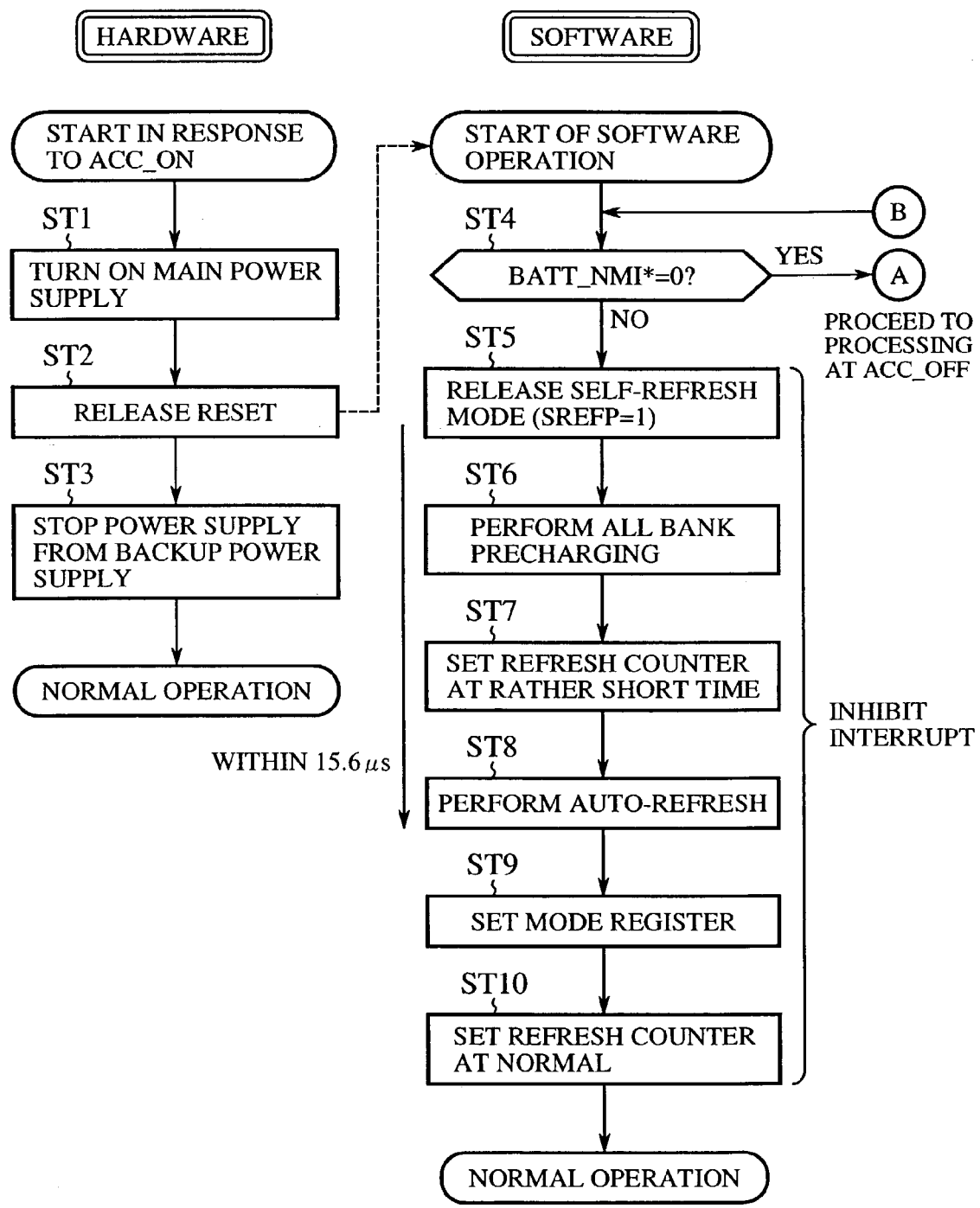

BACKUP MEMORY CONTROL UNIT WITH REDUCED CURRENT CONSUMPTION HAVING NORMAL SELF-REFRESH AND UNSETTLED MODES OF OPERATION

BACKGROUND OF THE INVENTION

1. Field of the Invention

The present invention relates to a backup memory control unit preferably serving as a backup to an SDRAM (synchronous DRAM).

2. Description of Related Art

A conventional backup memory control unit using a DRAM (dynamic random access memory) as a backup memory is disclosed in Japanese patent application laid-open No. 11-53271, for example. In this system, a normally energized CPU like a backup microcomputer controls the operating state of the DRAM, and carries out various types of control.

With the foregoing configuration, the conventional backup memory control unit using the DRAM as a backup memory must include the backup microcomputer besides the main CPU. In addition, the runaway risk is growing because of program bugs. Moreover, when the power supply is connected for the first time, it is necessary to turn on the main power supply first to place the DRAM in the self-refresh mode before entering into the backup state. This is because supplying the backup power before placing the DRAM in the self-refresh mode provides a problem of increasing the useless current consumption of the DRAM.

SUMMARY OF THE INVENTION

The present invention is implemented to solve the foregoing problem. It is therefore an object of the present invention to provide a backup memory control unit capable of reducing the current consumption of an inactive backup memory by eliminating the need for setting the backup memory in the self-refresh mode when the power supply is connected for the first time, but by setting up an unsettled mode of the backup memory, in which the power is not supplied to the backup memory.

Another object of the present invention is to provide a backup memory control unit capable of eliminating the runaway risk because of program bugs.

According to one aspect of the present invention, there is provided a backup memory control unit including: a volatile memory circuit having an unsettled mode in which no power is supplied, a normal operation mode and a self-refresh mode; a voltage detecting circuit for detecting a state of a supply voltage fed to a main power supply and a backup power supply; a power supply switching circuit for switching power supply to the memory circuit between these power supplies; and control means for controlling the power supply switching circuit in response to the supply voltage detected by the voltage detecting circuit, and for halting the power supply to the memory circuit in the unsettled mode. Thus, it can set the memory circuit at the unsettled mode in which no power is supplied to the memory circuit. It offers an advantage of being able to reduce the current consumption when the memory circuit is inactive state.

BRIEF DESCRIPTION OF THE DRAWINGS

FIG. 7 is a timing chart illustrating the operation of the CKE control circuit 7 in the embodiment 1 of the backup memory control unit in accordance with the present invention;

FIG. 9 is a flowchart illustrating the operation at system boot-up of the embodiment 1 of the backup memory control unit in accordance with the present invention;

DETAILED DESCRIPTION OF THE PREFERRED EMBODIMENTS

The invention will now be described with reference to the accompanying drawings.

Embodiment 1

The present embodiment 1 is described by way of example of a backup memory control unit for a volatile memory, particularly a synchronous DRAM (called "SDRAM" from now on), of a vehicle control circuit for controlling various portions mounted on a vehicle.

In the present embodiment 1 of the backup memory control unit, the SDRAM has three operation modes: an unsettled mode; a normal operation mode; and a self-refresh mode. The unsettled mode refers to a mode before initialization. The normal operation mode refers to a mode enabling the control program read from a CD-ROM by a CD-ROM drive to be written normally into the SDRAM. The self-refresh mode refers to a mode in which the SDRAM carries out the self-refresh operation.

In the unsettled mode of the SDRAM, in which the SDRAM is inactive, the supply of the backup power is halted to prevent an increase of the current consumption due to the supply of the backup power in the unsettled mode. This function is carried out by a hardware circuit rather than by a backup microcomputer.

Figure 1:
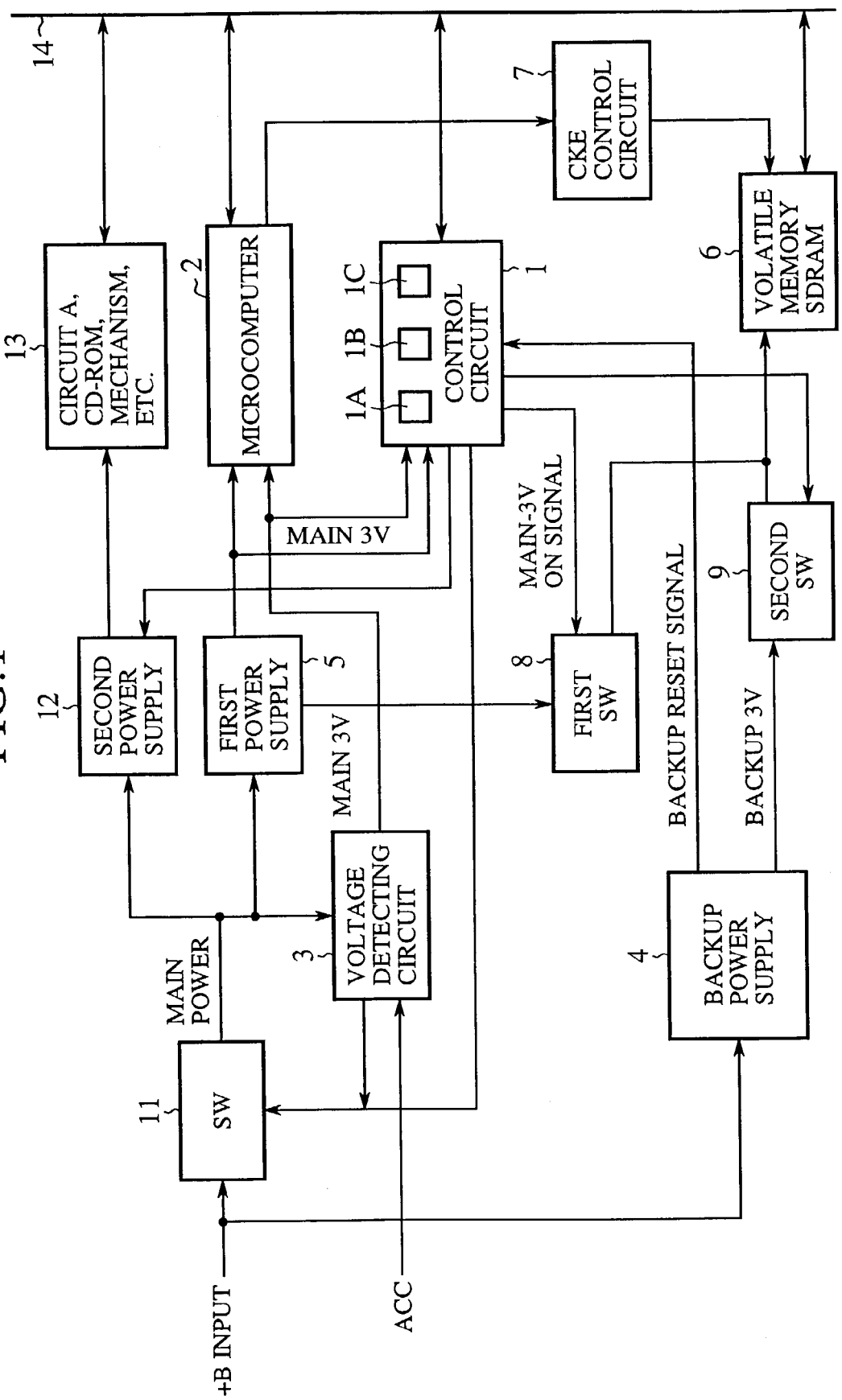
FIG. 1 is a block diagram showing a configuration of an embodiment 1 of the backup memory control unit in accordance with the present invention.

FIG. 1 is a block diagram showing a configuration of the embodiment 1 of the backup memory control unit in accordance with the present invention. In FIG. 1, the reference numeral 1 designates a control circuit including a hard timer circuit 1A, a power supply switching circuit 1B, and a main power supply on/off circuit 1C. The control circuit, which is always supplied with power from a backup power supply 4, outputs a main—3V ON signal of a "Low" level when the supply of the main power is started. The reference numeral 2 designates a microcomputer, and 3 designate a voltage detecting circuit for detecting the voltage level of the main power supply. The reference numeral 4 designates the backup power supply for outputting a backup reset signal and a backup 3V, and 5 designates a first power supply for generating the main—3V power from a +B power connected to a battery not shown. The reference numeral 6 designates a volatile memory, the SDRAM in the present embodiment 1. The SDRAM 6 stores the control program a CD-ROM drive reads from a CD-ROM as will be described below. The reference numeral 7 designates a CKE (clock enabling) control circuit, 8 designates a first switch circuit for turning on and off the main—3V power supply, 9 designates a second switch circuit for turning on and off the backup—3V power supply, 11 designates a main switch circuit, 12 designates a second power supply for supplying power to the CD-ROM drive and the like, and 13 designates a set of components requiring the power supply such as the CD-ROM drive and other mechanical components. The reference numeral 14 designates a system bus for connecting the microcomputer 2 with the control circuit 1, SDRAM 6 and circuit 13.

In FIG. 1, the symbol ACC designates a signal output in response to a state of an accessory switch of the vehicle, which takes "High" level in a power-on state. The +B input is an input from a battery.

Figure 2:
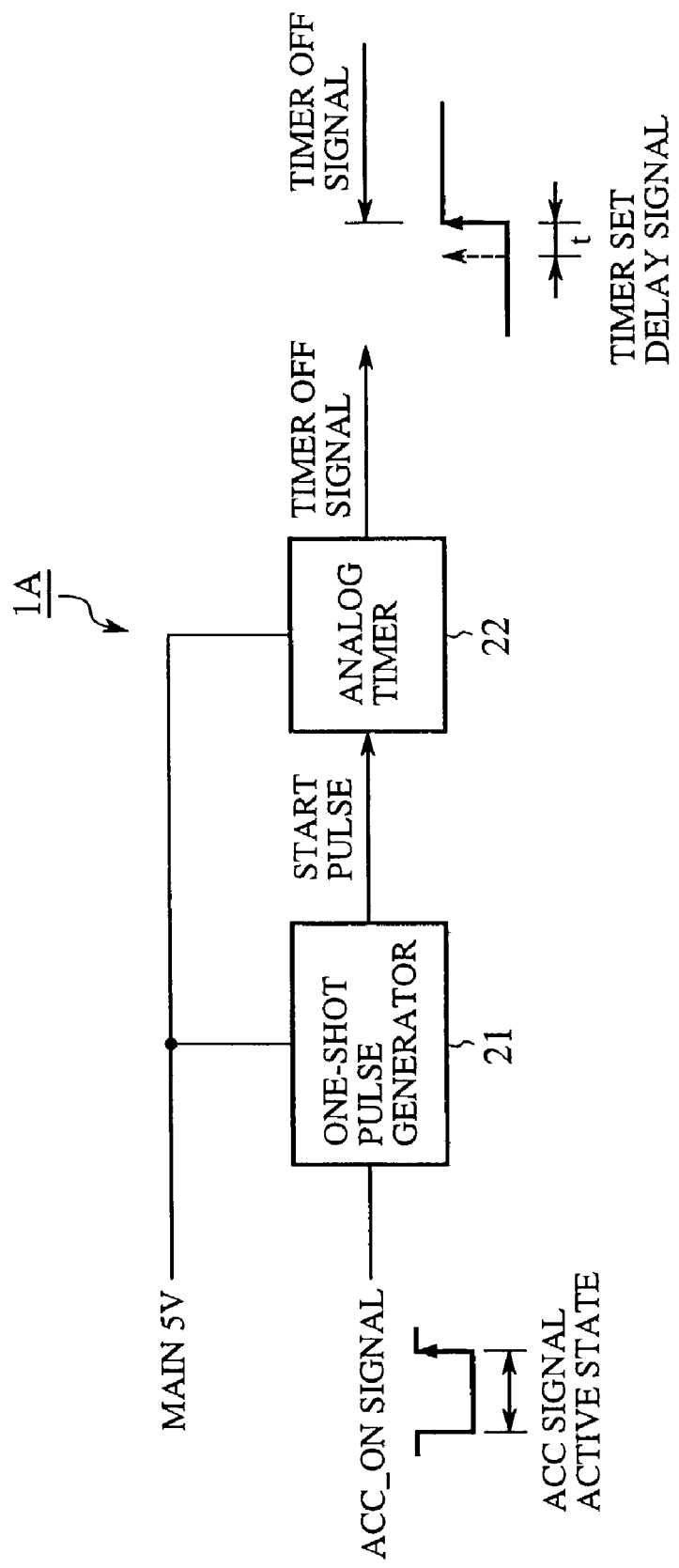
FIG. 2 is a circuit diagram showing a configuration of the hard timer circuit 1A in the embodiment 1 of the backup memory control unit in accordance with the present invention.

FIG. 2 is a circuit diagram showing a configuration of the hard timer circuit 1A as shown in FIG. 1. In FIG. 2, the reference numeral 21 designates a one-shot pulse generating circuit, and 22 designates an analog timer. The ACC_ON signal takes the "Low" level when the ACC signal becomes "High" level in response to ACC ON (turning on of the accessory switch). In the hard timer circuit 1A, the analog timer 22 starts its operation in response to a start pulse the one-shot pulse generating circuit 21 outputs in synchronization with a rising edge to the "High" level of the ACC_ON signal produced when the ACC signal is turned off (ACC OFF). The analog timer 22 generates a timer-off signal after the delay time determined by its resistor and capacitor.

Figure 3:
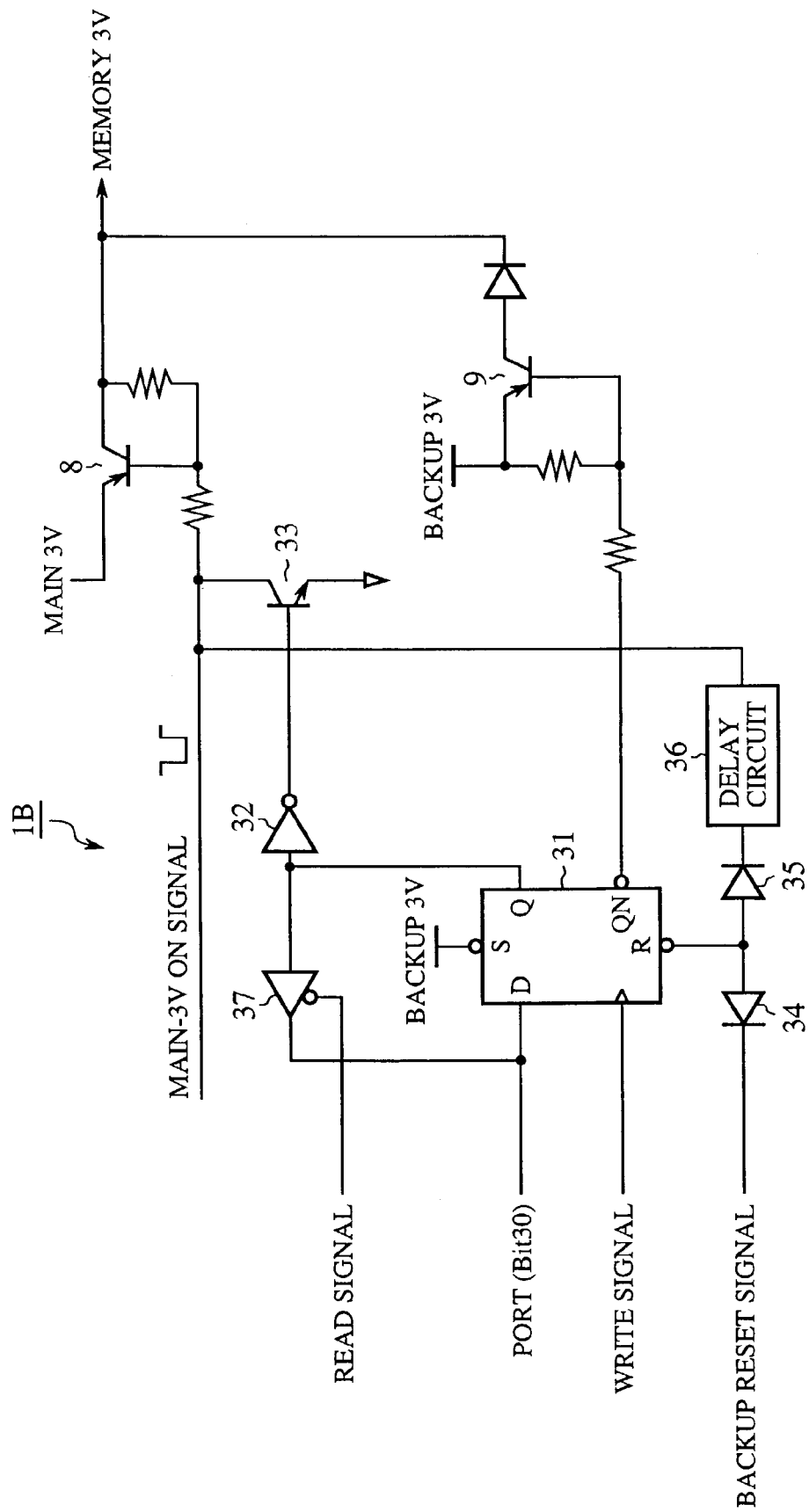
FIG. 3 is a circuit diagram showing a configuration of the power supply switching circuit 1B in the embodiment 1 of the backup memory control unit in accordance with the present invention.

FIG. 3 is a circuit diagram showing a configuration of the power supply switching circuit 1B. In FIG. 3, the same or like portions to those of FIG. 1 are designated by the same reference numerals, and the description thereof is omitted here. In FIG. 3, the reference numeral 31 designates a D flip-flop having a set terminal S and reset terminal R. It has its D-input terminal supplied with the output of a specified port (Bit30) of the microcomputer 2, and its clock input terminal supplied with a write signal from the microcomputer 2. In addition, it has its set input terminal supplied with the backup 3V from the backup power supply 4, and its reset input terminal supplied with a backup reset signal from the backup power supply shown in FIG. 4 or with the main—3V ON signal delayed by a delay circuit 36. The reference numeral 32 designates an inverter, and 33 designates a transistor for controlling the main—3V ON signal the control circuit 1 outputs when the main 3V enters into the ON state. Diodes 34 and 35 enable the reset of the D flip-flop 31 by the backup reset signal or main—3V ON signal. The reference numeral 36 designates the delay circuit, and 37 designates a buffer circuit with a control terminal. The buffer circuit 37 is used in the embodiment 2 that will be described below. It supplies the port (Bit30) of the microcomputer 2 with a signal +B_DOWN* so that the microcomputer 2 makes a decision as to whether the backup up to that time has been carried out normally in the boot-up operation of the system in response to the ACC ON.

Figure 4:
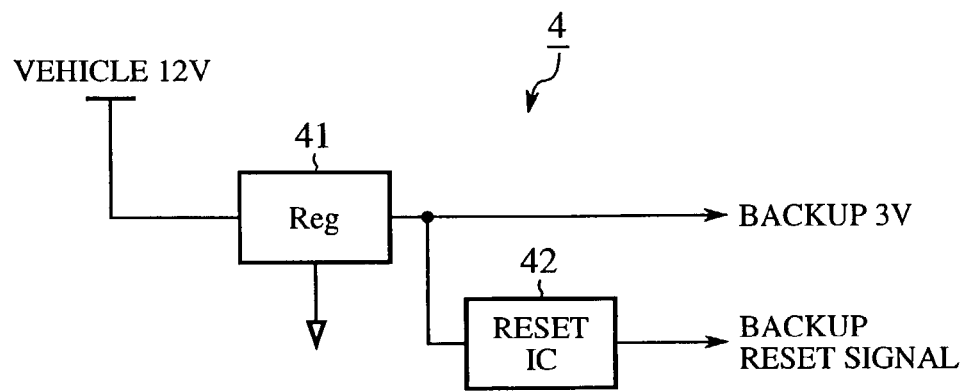
FIG. 4 is a circuit diagram showing a configuration of the backup power supply 4 in the embodiment 1 of the backup memory control unit in accordance with the present invention.

FIG. 4 is a circuit diagram showing a configuration of the backup power supply 4. In FIG. 4, the reference numeral 41 designates a regulator for generating the backup—3V power supply from the 12V power supply consisting of the battery mounted on the vehicle. The reference numeral 42 designates a reset IC for generating the backup reset signal from the backup—3V power supply. The reset IC 42 generates the backup reset signal that falls to the "Low" level when the value of the backup 3V becomes 3 V, a backup threshold value of the SDRAM 6, and rises to the "High" level at 3.2 V.

The backup power supply 4 generates the backup—3V power serving as the backup for the power supply switching circuit 1B and the SDRAM 6. The reset IC 42 carries out the initial set of the power supply switching circuit 1B. The reset voltage is set at the backup threshold value of the SDRAM 6 to prevent the program runaway caused by inappropriate rewriting of the SDRAM 6 because of the voltage drop of the backup—3V power supply.

Figure 5:
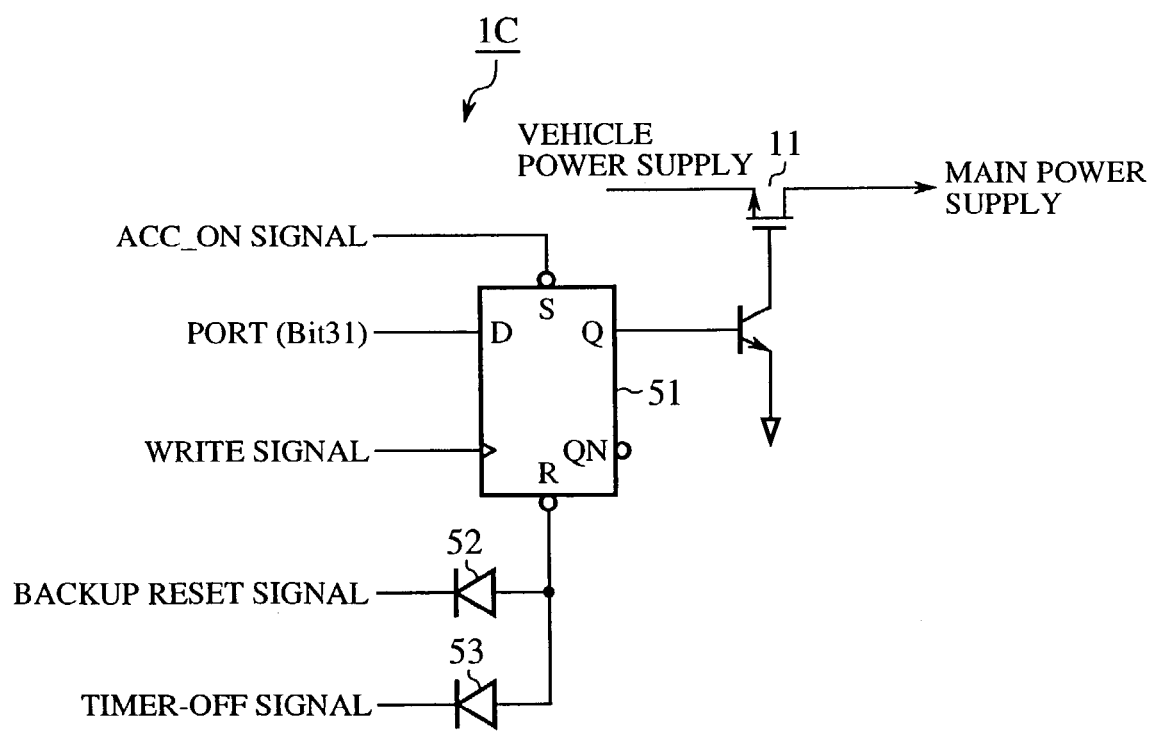
FIG. 5 is a circuit diagram showing a configuration of the main power supply on/off circuit 1C in the embodiment 1 of the backup memory control unit in accordance with the present invention.

FIG. 5 is a block diagram showing a configuration of the main power supply on/off circuit 1C. In FIG. 5, the same or like portions to those of FIG. 1 are designated by the same reference numerals, and the description thereof is omitted here. In FIG. 5, the reference numeral 51 designates a D flip-flop having a set terminal and a reset terminal. The D flip-flop has its D-input terminal supplied with the output from the specified port (Bit31) of the microcomputer 2, and has its clock input terminal supplied with a write signal output from the microcomputer 2. In addition, it has its set input terminal supplied with the ACC_ON signal, and the reset input terminal supplied with the backup reset signal or timer-off signal. Reference numerals 52 and 53 each designate a diode for enabling the reset of the D flip-flop 51 by the backup reset signal or timer-off signal.

When the power supply of the vehicle is turned on, the ACC_ON signal becomes "Low" level and the D flip-flop 51 is set. Thus, its Q output becomes "High" level and the main switch circuit 11 is brought into conduction, thereby supplying the main power through the main power supply on/off circuit 1C.

In contrast, when the power supply of the vehicle is turned off, the ACC_ON signal becomes "High" level, thereby enabling writing of the port output (Bit31) of the microcomputer 2 to the D flip-flop 51. When the port output (Bit31) is written by the write signal, the Q output becomes "Low" level. This brings the main switch circuit 11 out of conduction, thereby halting the main power supply. In this case also, when the port output (Bit31) is not written during the time when the ACC_ON signal rises to the "High" level to the time when the hard timer circuit 1A concludes its predetermined elapsed time, the D flip-flop 51 is reset by the timer-off signal the hard timer circuit 1A outputs when it completes the predetermined elapsed time. Thus, the main switch circuit 11 is brought out of conduction, and the main power supply is forcibly stopped. The circuit configuration, in which the backup reset signal resets the D flip-flop 51, can prevent accidental conduction of the main switch circuit 11 by positively resetting the D flip-flop 51 at the power-up of the system, thereby being able to prevent the main power from being supplied.

Figure 6:
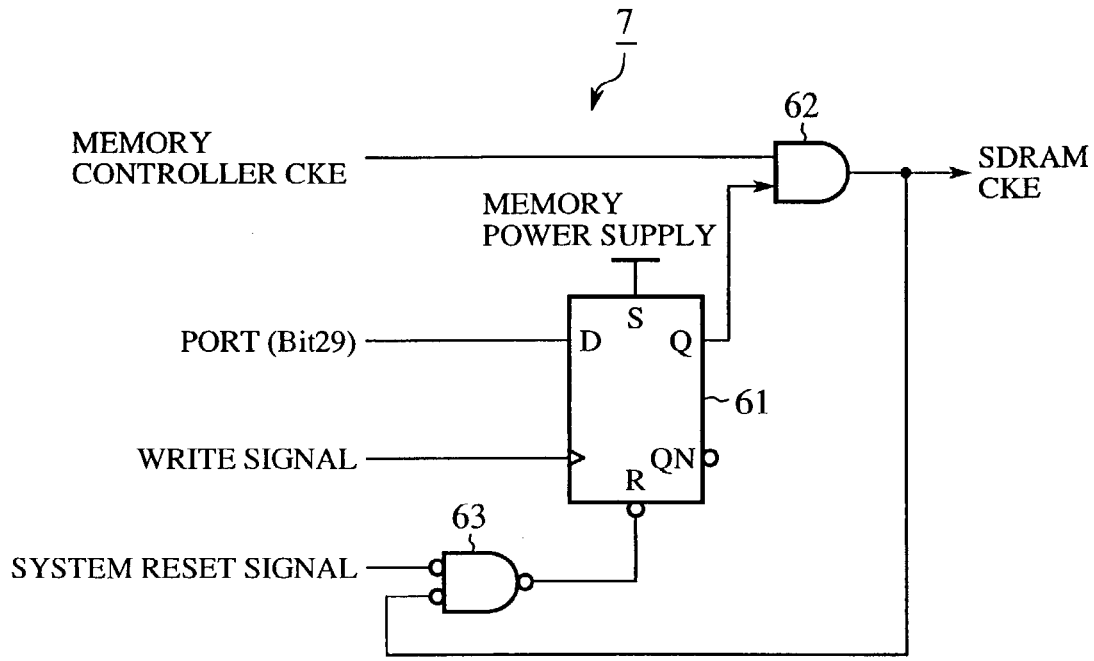
FIG. 6 is a circuit diagram showing a configuration of the CKE control circuit 7 in the embodiment 1 of the backup memory control unit in accordance with the present invention.

FIG. 6 is a circuit diagram showing a configuration of the CKE control circuit 7. It determines the CKE (clock enabling) state of the SDRAM 6 according to the state of the CKE terminal and the state of a port (Bit29) of the memory controller (microcomputer 2). In addition, it enables the CKE of the SDRAM 6 to be fixed independently of the state of the CKE terminal in the memory controller unsettled state. In FIG. 6, the reference numeral 61 designates a D flip-flop having a set terminal and a reset terminal, 62 designates an AND circuit, and 63 designates an OR circuit. The D flip-flop 61 has its D-input terminal supplied with the output of the specified port (Bit29) of the microcomputer 2, and its clock input terminal supplied with the write signal from the microcomputer 2. In addition, it has its set input terminal supplied with the memory power supply, and its reset input terminal supplied with the output of the OR circuit 63.

FIG. 7 is a timing chart illustrating the operation of the CKE control circuit 7. From time t0 to immediately before time t1 is a system reset period after the power-up, in which the CKE signal of the SDRAM 6 the CKE control circuit 7 outputs maintains the "Low" level because the D flip-flop 61 is reset by the "Low" level system reset signal. This period from the time t0 to immediately before the time t1 is a period during which the self-refresh mode is maintained.

At time t1, the system reset signal rises to the "High" level because the system reset is released. Thus, the reset state of the D flip-flop 61 is released.

From the time t1 to immediately before time t2, the D flip-flop 61 holds the reset state, thereby maintaining the self-refresh mode of the SDRAM 6.

At the time t2 after the memory controller mode is set, the self-refresh mode of the SDRAM 6 is released in response to the output of the port (Bit29). At the time t2, both the memory controller CKE and the output of the port (Bit29) take the "High" level. Accordingly, the "High" level of the output of the port (Bit29) is read by the rising edge of the write signal so that the Q output of the D flip-flop 61 rises to the "High" level. Since the memory controller CKE is placed at the "High" level at that time, the CKE signal of the SDRAM 6, the output of the AND circuit 62, rises to the "High" level at the time when the Q output of the D flip-flop 61 rises to the "High" level.

From the time t2 to time t3 is the self-refresh mode release period of the SDRAM 6. At the time t3, the memory controller CKE falls to the "Low" level. Thus, the output of the AND circuit 62, that is, the CKE signal of the SDRAM 6, makes a transition to the "Low" level, so that the CKE signal of the SDRAM 6 is masked. At time t4, at which the output from the port (Bit29) is the "Low" level, the write signal rises, in response to which the "Low" level of the output of the port (Bit29) is read so that the Q output of the D flip-flop 61 shifts to the "Low" level.

Next, the operation of the present embodiment 1 will be described.

Figure 8:
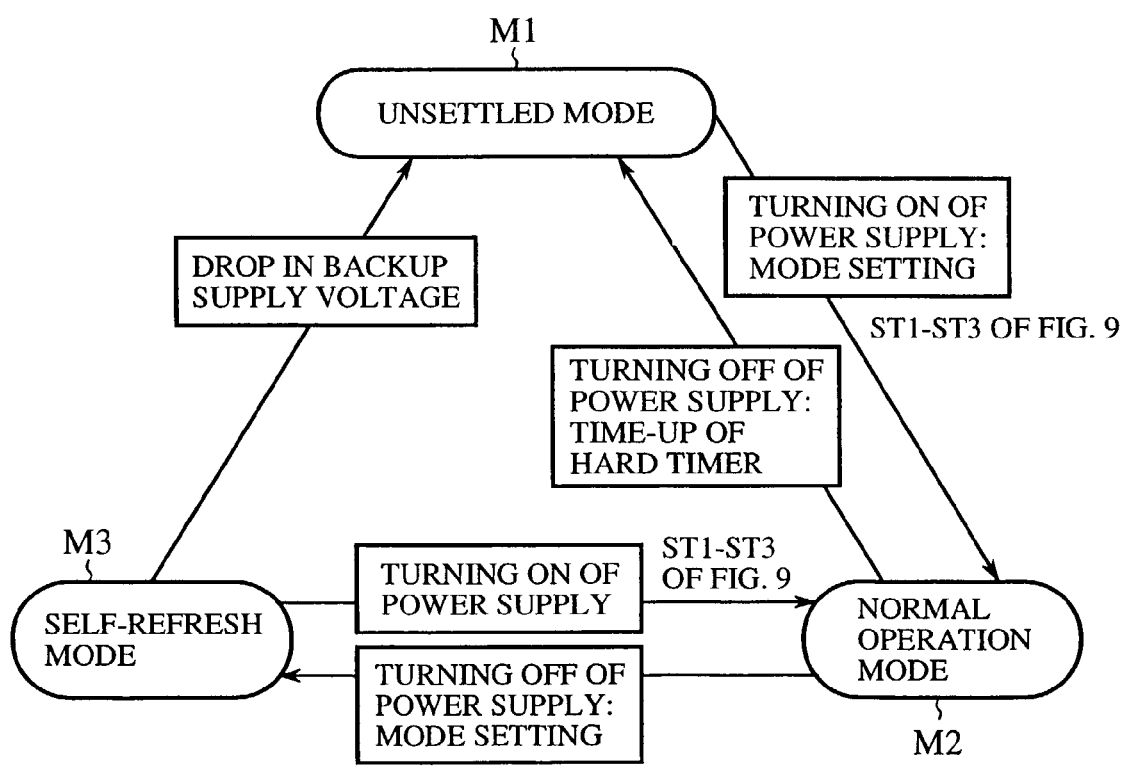
FIG. 8 is a mode transition diagram of the SDRAM 8 in the embodiment 1 of the backup memory control unit in accordance with the present invention.

As shown in the mode transition diagram of FIG. 8, the present embodiment has three modes of the SDRAM 6: the unsettled mode M1; the normal operation mode M2; and the self-refresh mode M3. When the power supply is turned on (ACC ON) in the unsettled mode state M1, the SDRAM 6 shifts its mode to the normal operation mode M2. In contrast, when the power supply is turned off (ACC OFF) and the time is up of the hard timer circuit 1A in the normal operation mode M2, the SDRAM 6 returns to the unsettled mode M1, in which the power is not supplied to the SDRAM 6.

When an ACC_INT* interrupt occurs during the time period from the turn-off of the power supply (ACC OFF) to the time-up of the hard timer circuit 1A in the normal operation mode M2, the SDRAM 6 shifts its mode to the self-refresh mode M3.

In the self-refresh mode M3, the backup power supply 4 backs up the SDRAM 6. When the power supply is turned on (ACC ON) in the self-refresh mode M3, the SDRAM 6 shifts its mode to the normal operation mode M2. If the voltage of the backup power supply 4 that backs up the SDRAM 6 drops in the self-refresh mode M3, the microcomputer 2 halts its operation, and the SDRAM 6 shifts its mode to the unsettled mode M1 in which the power is not supplied.

Next, the operation of the present embodiment 1 of the backup memory control unit will be described under the following three phases: an initial power supply connecting phase in which the backup memory control unit is connected to the +B input for the first time; a system boot-up phase according to the ACC ON; and a system quitting phase according to the ACC OFF.

First, the operation in the initial power supply connecting phase will be described.

In the initial power supply connecting phase, in which the system is connected to the 12V power supply of the battery of the vehicle for the first time, the backup 3V rises from 0V to 3V. Thus, the backup reset signal is generated as shown in FIG. 4. As a result, The D flip-flop 31 is reset via the diode 34 of the power supply switching circuit 1B as shown in FIG. 3, and the second switch circuit 9 is fixed at the OFF state. In addition, the main switch circuit 11 is also in the OFF state, and the main 3V and main—3V ON signal are not output. Thus, the memory—3V power supply is not output so that the SDRAM 6 is in the unsettled mode.

Next, the operation at the system boot-up in response to the ACC ON will be described.

FIG. 9 is a flowchart illustrating the operation at the system boot-up in the embodiment 1 of the backup memory control unit in accordance with the present invention. In the system boot-up, the SDRAM 6 is in the self-refresh mode M3 or unsettled mode M1. In the self-refresh mode M3, the SDRAM 6 is backed up by the backup—3V power fed from the backup power supply 4. In the unsettled mode M1, the SDRAM 6 is not supplied with power. The system boot-up operation in these cases is shown in FIG. 8, as the mode transition from the self-refresh mode M3 to the normal operation mode M2, or from the unsettled mode M1 to the normal operation mode M2.

First, the transition from the self-refresh mode M3 to the normal operation mode M2 will be described. In response to the ACC ON (turning on of the accessory switch of the vehicle), the ACC signal is output. The ACC signal with the "Low" level indicates the ON state. In response to the ACC signal, the ACC_ON signal of the "Low" level is output. Accordingly, the D flip-flop 51 of the main power supply on/off circuit 1C as shown in FIG. 5 is set, and outputs from its Q output terminal the "High" level signal. Thus, the main switch circuit 11 is brought into the ON state so that the main power is supplied from the +B input (step ST1). In response to the main power supply, the system reset signal is output for a fixed period, followed by the release of the system reset (step ST2), and by the operation of the microcomputer 2.

In addition, in response to the turn-on of the main power supply, the control circuit 1 supplies the power supply switching circuit 1B with the main—3V ON signal of the "Low" level. Accordingly, the first switch circuit 8 is brought into the ON state by the main—3V ON signal so that the main—3V power is supplied to the SDRAM 6 as the memory—3V power. The main—3V ON signal is also fed to the reset terminal of the D flip-flop 31 via the delay circuit 36 and the diode 35 to put the D flip-flop 31 in the reset state. Thus, a "High" level signal is output from its QN output terminal so that the second switch circuit 9 is brought into the OFF state. Thus, the power supply of the backup—3V power from the backup power supply 4 to the SDRAM 6 is suspended (step ST3). In this case, since the D flip-flop 31 outputs a "Low" level signal from its Q output terminal, the transistor 33 is brought into the ON state.

Starting its operation at step ST2, the microcomputer 2 begins its software operation and makes a decision as to the interrupt signal BATT_NMI* generated as a result of the voltage detected by the voltage detecting circuit 3 (step ST4). The interrupt signal BATT_NMI*, which is a resultant signal of the decision by the voltage detecting circuit 3 as to whether the voltage level of the +B input exceeds a specified value or not, becomes "1" when it exceeds the specified value, but "0" when it does not exceed. When the voltage level of the +B input exceeds the specified value, the output of the port (Bit29) of the microcomputer 2 supplied to the D-input terminal of the D flip-flop 61 of the CKE control circuit 7 as shown in FIG. 6 is fixed at the "High" level as shown in FIG. 7(c), and the write signal is supplied to the clock input terminal of the D flip-flop 61 at the time t2 as shown in FIG. 7(d). As a result, the self-refresh mode of the SDRAM 6 is released (step ST5) which is maintained from the time t0 at which the main power supply is turned on at step ST1. Subsequently, precharging of all the banks is carried out (step ST6), followed by setting a refresh counter rather short (step ST7), by automatic refresh (step ST8), by setting a mode register (step ST9), and by setting the refresh counter at a normal state (step ST10). Thus, the SDRAM 6 shifts to the normal operation mode M2.

Incidentally, the interrupt is inhibited during the processing from step ST5 to step ST10.

Figure 10:
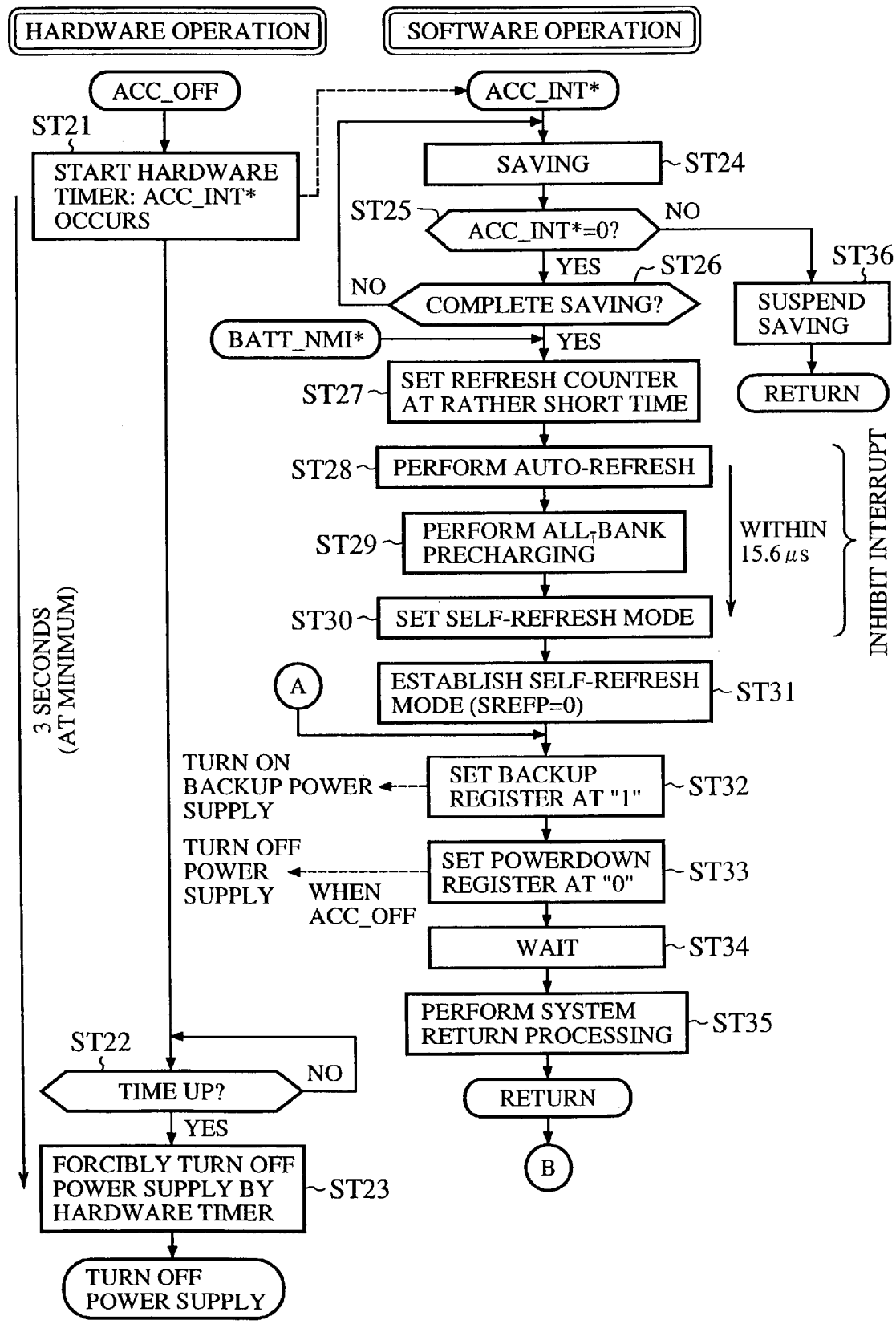
FIG. 10 is a flowchart illustrating the operation at system quitting in the embodiment 1 of the backup memory control unit in accordance with the present invention.

If the voltage level of the +B input does not exceed the specified value at step ST4, the drop in the power supply voltage of the +B input is assumed, and the processing proceeds to step ST32 of FIG. 10 without releasing the self-refresh mode M3. At step ST32, the microcomputer 2 sets a backup register at "1", and carries out the control to enable the backup using the backup—3V power supply of the backup power supply 4. More specifically, the microcomputer 2 places its port (Bit30) at the "High" level, supplies it to the D-input terminal of the D flip-flop 31 in the power supply switching circuit 1B as shown in FIG. 3, and supplies the write signal to the clock input terminal of the D flip-flop 31. Then, the microcomputer 2 brings the second switch circuit 9 into the ON state to supply the SDRAM 6 with the memory—3V power not only from the main—3V power supply 5, but also from the backup—3V power supply 4. Subsequently, it sets a power-down register at "0" (step ST33), and enters a waiting mode to wait for the lowered voltage level of the +B input to return (step ST34). Then, it executes the system recovery processing (step ST35), returning to step ST4 of FIG. 9.

Next, the mode transition from the unsettled mode M1 to the normal operation mode M2 will be described. The operation also proceeds along the same flowchart as shown in FIG. 9 used for explaining the mode transition from the self-refresh mode M3 to the normal operation mode M2.

Thus, when the voltage level of the +B input is normal at the system boot-up by the ACC ON, the self-refresh mode M3 is released independently of whether the current mode is the unsettled mode M1 or the self-refresh mode M3. Then, the processing from step ST6 to step ST10 carried out so that the SDRAM 6 makes a transition to the normal operation mode M2, and is supplied with the main—3V power. In contrast, when the voltage level of the +B input is not normal such as it drops temporarily, the microcomputer 2 waits for the voltage level to return to the normal level at step ST34, and then releases the self-refresh mode M3, followed by the processing from step ST6 to step ST10. Thus, the SDRAM 6 shifts to the normal operation mode M2.

In this way, at the system boot-up in response to the ACC ON, the SDRAM 6 makes a transition to the normal mode M2 independently of whether the SDRAM 6 is in the unsettled mode M1 or self-refresh mode M3 through the processing illustrated in FIG. 9 and the processing from step ST32 to step ST35 illustrated in FIG. 10.

Next, the operation will be described when the voltage level of the +B input drops for rather a long time at the system boot-up in response to the ACC ON. In this case also, the supply of the backup 3V from the backup power supply 4 is halted at step ST3 of FIG. 9 independently of whether the SDRAM 6 is in the unsettled mode M1 or the self-refresh mode M3. Subsequently, proceeding from step ST4 to step ST32 of FIG. 10, the software waits for the recovery of the level of the voltage supplied from the backup power supply 4. However, when the voltage level of the +B input falls only, the voltage level of the backup 3V fed from the backup power supply 4 also drops so that the SDRAM 6 makes a transition to the unsettled mode M1. The operation is illustrated in FIG. 8 as the mode transition from the self-refresh mode M3 to the unsettled mode MI because of the voltage drop in the backup power supply.

FIG. 10 is a flowchart illustrating the operation at the system quitting in response to the ACC OFF in the embodiment 1 of the backup memory control unit in accordance with the present invention. At the system quitting, the SDRAM 6 is in the normal operation mode M2. The operation at the system quitting is illustrated in FIG. 8 as the mode transition from the normal operation mode M2 to the self-refresh mode M3 or to the unsettled mode M1.

The transition from the normal operation mode M2 to the self-refresh mode M3 or to the unsettled mode M1 will be described with reference to the flowchart of FIG. 10. The hard timer circuit 1A starts its counting when the ACC signal is turned off, that is, in synchronization with the rising edge to the "High" level of the ACC_ON signal in response to the ACC OFF. Then, it generates the timer-off signal after the predetermined delay time has elapsed which is determined by its resistor and capacitor. In this case, if an interrupt signal ACC_INT* occurs before the hard timer circuit 1A outputs the timer-off signal, the microcomputer 2 starts its software operation (step ST21).

Even if the interrupt signal ACC_INT* does not occur, when the time is up of the hard timer circuit 1A (step ST22), the hard timer circuit 1A brings the main switch circuit 11 into the OFF state by compulsion to turn off the main power supply (step ST23). The mode transition in which the hard timer circuit 1A turns off the power supply forcibly when the interrupt signal ACC_INT* does not occur is illustrated in FIG. 8 as the mode transition from the normal operation mode M2 to the unsettled mode M1.

Starting the software operation in response to the interrupt signal ACC_INT*, the microcomputer 2 saves the data stored in the registers and memories including the SDRAM 6 (step ST24). In addition, to prevent a malfunction because of an instantaneous power interruption, the microcomputer 2 checks the interrupt signal ACC_INT* after 10 msec has elapsed from the time it occurs (step ST26). If it is still present, the microcomputer 2 sets the refresh counter at a rather short time (step ST27), carries out the automatic refresh (step ST28), makes the precharging of all the banks (step ST29), sets the self-refresh mode (step ST30), establishes the self-refresh mode (step ST31), sets the backup register at "1" to supply the backup 3V to the SDRAM 6 (step ST32), starts the backup to the SDRAM 6, sets the power-down register to "0" to turn off the main power supply when the ACC OFF (step ST33), carries out the waiting (step ST34), and executes the system recovery processing (step ST35).

If the microcomputer 2 cannot verify the interrupt signal ACC_INT* at step ST25, it proceeds to an address for executing a specified processing after halting the saving processing at step ST24 (step ST36).

In contrast, if the drop in the voltage level of the +B input causes the interrupt signal BATT_NMI*, the processing proceeds to step ST27 and on: it sets the refresh counter at a shorter value to make backup as quick as possible (step ST27) followed by the processing at steps ST28, ST29 and ST30, thereby establishing the self-refresh mode M3 (step ST31). As a result, the SDRAM 6 enters into the backup mode in which the backup—3V power is supplied from the backup power supply 4. If the voltage level of the backup—3V power drops, the SDRAM 6 shifts from the self-refresh mode M3 to the unsettled mode M1.

In FIG. 8, the mode transition due to the interrupt signal BATT_NMI* because of the drop in the voltage level of the +B input in the normal operation mode M2 is represented as the mode transition from the normal operation mode M2 to the self-refresh mode M3, and then to the unsettled mode M1.

As described above, the present embodiment 1 has three modes of the SDRAM 6, the unsettled mode M1, the normal operation mode M2 and the self-refresh mode M3, and the power supply is halted in the unsettled mode M1. In addition, at the system boot-up in response to the ACC ON, the SDRAM 6 can shift to the normal operation mode M2 independently of whether the SDRAM 6 is in the unsettled mode M1 or self-refresh mode M3, without holding the mode before the system boot-up. The processing is carried out through the procedure illustrated in the flowchart of FIG. 9 and steps ST32–ST35 of FIG. 10 common to the unsettled mode M1 and self-refresh mode M3.

In addition, even if the runaway or freeze of the microcomputer 2 occurs and the program cannot operate normally at the system quitting by the ACC OFF, the processing by the hardware, that is, the time-up of the hard timer circuit 1A, enables the SDRAM 6 to make a safe transition from the normal operation mode M2 to the self-refresh mode M3 or to the unsettled mode M1. Thus, the power supply to the SDRAM 6 can be halted in the unsettled mode M1.

Embodiment 2

Figure 11:
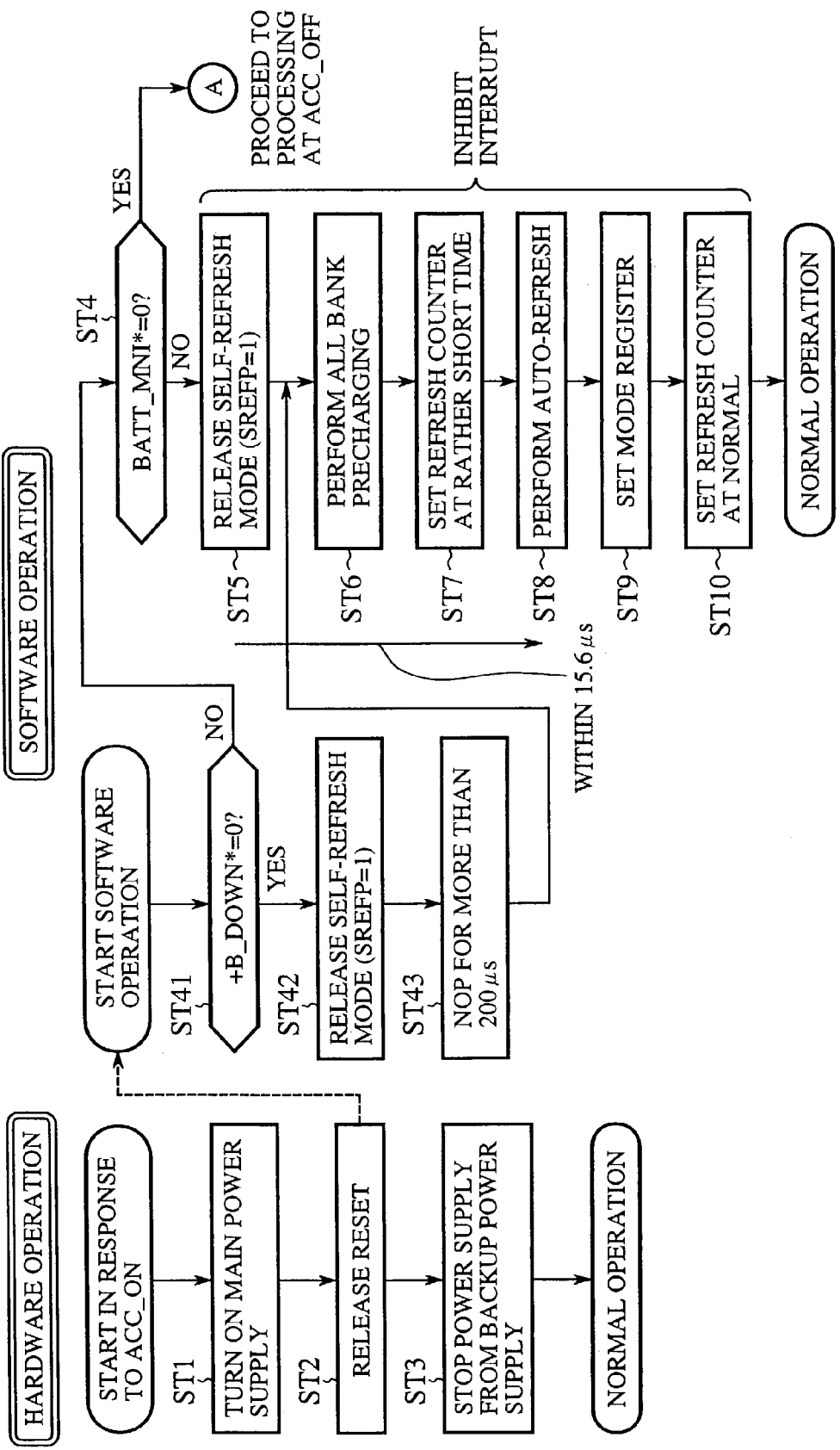
FIG. 11 is a flowchart illustrating the operation at system boot-up of an embodiment 2 of the backup memory control unit in accordance with the present invention.

FIG. 11 is a flowchart illustrating the operation at the system boot-up of an embodiment 2 of the backup memory control unit in accordance with the present invention. In FIG. 11, the same or like portions to those of FIG. 9 are designated by the same reference numerals, and the description thereof is omitted here. In the present embodiment 2, the signal +B_DOWN* is supplied from the buffer 37 to the port (Bit30) of the microcomputer 2 (see, FIG. 3) by the read signal fed to the control terminal of the buffer circuit 37 at the system boot-up in response to the ACC ON. In response to the signal +B_DOWN*, a decision is made as to whether the backup so far is made normally or not (step ST41). If the decision is made that the power supply is halted, the self-refresh mode establishment is released (step ST42), followed by waiting of 200 μs considering the characteristics of the SDRAM 6 used as the memory (step ST43), by the processing from step ST6 to step ST10, and by the transition to the normal operation.

Thus, the present embodiment 2 makes a decision as to whether the backup up to that time is made normally or not at the system boot-up in response to the ACC ON, and if it decides that the backup of the SDRAM 6 is not made normally, it causes the SDRAM to shift to the normal operation mode M2 by releasing the self-refresh mode establishment. As a result, the present embodiment 2 of the backup memory control unit offers an advantage of being able to improve the reliability of the data stored in the SDRAM 6 at the system boot-up in response to the ACC ON.

What is claimed is:

1. A backup memory control unit comprising:
   a memory circuit having an unsettled mode in which no power is supplied, a normal operation mode and a self-refresh mode, said memory circuit being a volatile memory;
   a main power supply for supplying said memory circuit with main power;
   a backup power supply for supplying said memory circuit with backup power;
   a voltage detecting circuit for detecting a state of a supply voltage fed to said main power supply and said backup power supply;
   a power supply switching circuit for switching power supplied to said memory circuit between said main power supplied by said main power supply and said backup power supplied by said backup power supply; and
   control means for controlling said power supply switching circuit in response to the state of the supply voltage detected by said voltage detecting circuit, and for halting the power supplied to said memory circuit in the unsettled mode.

2. The backup memory control unit according to claim 1, wherein said control means comprises:
   an initial set circuit for initializing said power supply switching circuit when the power is supplied for the first time; and
   an initial setting-time unsettled mode fixing circuit for setting said memory circuit at the unsettled mode when said initial set circuit initializes said power supply switching circuit.

3. The backup memory control unit according to claim 1, wherein said control means comprises:
   a backup power supply halting circuit for halting supply of said backup power from said backup power supply to said memory circuit, when a specified manipulation signal is turned on in one of the unsettled mode and self-refresh mode; and
   software control means for making a decision as to a voltage drop in the main power supply in response to the state of the main power supply detected by said voltage detecting circuit when said specified manipulation signal is turned on, and for carrying out one of a mode transition and a power supply in response to the decision result, said mode transition shifting the mode of said memory circuit to the self-refresh mode, and said power supply feeding power from said backup power supply to said memory circuit through switching control of said power supply switching circuit.

4. The backup memory control unit according to claim 3, wherein said control means comprises:

a normal operation-time main power supply breaking circuit for forcibly stopping supply of said main power to said memory circuit after a predetermined time has elapsed when the specified manipulation signal is turned off in the normal operation mode of said memory circuit, and wherein said software control means controls said backup power supplied from said backup power supply to said memory circuit by controlling said power supply switching circuit when the specified manipulation signal is turned off.

5. The backup memory control unit according to claim 1, wherein said control means comprises:

a backup-time unsettled mode transition circuit for making a transition of said memory circuit from the self-refresh mode to the unsettled mode by stopping supply of said backup power by said backup power supply when a voltage drop in said backup power supplied to said memory circuit occurs in the self-refresh mode of said memory circuit.

6. The backup memory control unit according to claim 1, wherein said control means further comprises means for making a decision as to whether supply of the backup power by said backup power supply to said memory circuit is carried out normally up to a time when said main power supply is turned on.

* * * * *